United States Patent
Sasaki et al.

(10) Patent No.: US 11,864,354 B2
(45) Date of Patent: Jan. 2, 2024

(54) OPTICAL COMMUNICATION MODULE EQUIPPED WITH HEATSINK

(71) Applicant: FUJITSU OPTICAL COMPONENTS LIMITED, Kawasaki (JP)

(72) Inventors: Kazuya Sasaki, Yokohama (JP); Takatoshi Yagisawa, Kawasaki (JP); Tsutomu Ohtsu, Hino (JP); Masami Kamioka, Tochigi (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 156 days.

(21) Appl. No.: 17/481,492

(22) Filed: Sep. 22, 2021

(65) Prior Publication Data

US 2022/0104388 A1 Mar. 31, 2022

(30) Foreign Application Priority Data

Sep. 25, 2020 (JP) .................. 2020-160480

(51) Int. Cl.
*H05K 7/14* (2006.01)
*H05K 7/20* (2006.01)
*H04B 10/40* (2013.01)

(52) U.S. Cl.
CPC ......... *H05K 7/2039* (2013.01); *H05K 7/1427* (2013.01); *H04B 10/40* (2013.01)

(58) Field of Classification Search
CPC ..... H05K 7/2039; H05K 7/1427; H04B 10/40
See application file for complete search history.

(56) References Cited

U.S. PATENT DOCUMENTS

| | | | |
|---|---|---|---|
| 6,508,595 B1 | 1/2003 | Chan et al. | |
| 7,576,988 B2 * | 8/2009 | Schwarz | H05K 7/20472 361/708 |
| 11,275,223 B1 * | 3/2022 | Lin | G02B 6/4246 |
| 2003/0059176 A1 | 3/2003 | Chan et al. | |
| 2013/0051738 A1 | 2/2013 | Ito | |
| 2014/0202755 A1 | 7/2014 | Ito | |
| 2014/0286613 A1 | 9/2014 | Ito et al. | |
| 2016/0066469 A1 | 3/2016 | Salamon et al. | |
| 2019/0215989 A1 | 7/2019 | Su et al. | |
| 2021/0105025 A1 * | 4/2021 | Wall, Jr. | H04B 10/116 |

FOREIGN PATENT DOCUMENTS

| | | |
|---|---|---|
| JP | 2002-26441 A | 1/2002 |
| JP | 2013-51133 A | 3/2013 |

* cited by examiner

*Primary Examiner* — Anthony Q Edwards
*Assistant Examiner* — Hung Q Dang
(74) *Attorney, Agent, or Firm* — STAAS & HALSEY LLP

(57) ABSTRACT

An optical communication module includes: a circuit board; optical communication devices that are provided on an upper surface side of the circuit board; a case that accommodates the circuit board and the optical communication devices; and a heatsink that is attached to the case. The optical communication devices include a first device and a second device. The first device is located closer to an inlet opening for cooling air for cooling the heatsink than the second device is. A height from the circuit board to a top of the first device is greater than a height from the circuit board to a top of the second device. The heatsink is not equipped with a cooling fin in a first region where the first device is provided, and the heatsink is equipped with a cooling fin in a second region where the second device is provided.

7 Claims, 9 Drawing Sheets

OPTICAL COMMUNICATION MODULE EQUIPPED WITH HEATSINK

CROSS-REFERENCE TO RELATED APPLICATION

This application is based upon and claims the benefit of priority of the prior Japanese Patent Application No. 2020-160480, filed on Sep. 25, 2020, the entire contents of which are incorporated herein by reference.

FIELD

The embodiments discussed herein are related to an optical communication module that is equipped with a heatsink.

BACKGROUND

Multi-source agreement (MSA) for ensuring compatibility of optical communication modules such as optical transceiver modules has been created in recent years. For example, CFP2, QSFP-DD, and OSFP have been widespread as MSAs for 400G optical communication modules. A plurality of vendors have been developing optical communication modules compliant with the MSA.

MSA primarily defines electrical interfaces and machine interfaces, but there are few definitions pertaining to heat dissipation. Thus, there is some degree of freedom in design for heat dissipation structures or heat dissipation characteristics.

Heat dissipation structures for optical modules are described in, for example, U.S. Patent Publication No. 2016/0066469, U.S. Patent Publication No. 2019/0215989, Japanese Laid-open Patent Publication No. 2002-026441. A structure for reducing noise emission of an optical module is described in, for example, Japanese Laid-open Patent Publication No. 2013-051133.

Some MSAs have been created, as described above, for optical communication modules such as optical transceiver modules, but functions may be added to the optical modules or the functions of the optical modules may be changed. Adding or changing a function may increase power consumption of an optical communication module. In this case, for example, the shape of a heatsink may need to be changed to enhance a cooling performance. In accordance with addition of, or a change in, a function, the size of components to be implemented in an optical communication module (e.g., a laser element) may be increased. In this case, the shape of the heatsink may also need to be changed.

However, in many cases, an optical communication module such as an optical transceiver module is used by being inserted into a space determined in advance. For example, an optical transceiver module is often inserted into a slot in an optical transmitter device. Thus, the shape of a heatsink may be incapable of being freely changed. Alternatively, when cooling an optical communication module by sending cooling air, an airflow impedance may be increased, thereby worsening heat dissipation characteristics.

SUMMARY

According to an aspect of the embodiments, an optical communication module includes: a circuit board; optical communication devices that are provided on an upper surface side of the circuit board; a case that accommodates the circuit board and the optical communication devices; and a heatsink that is attached to the case. The optical communication devices include a first device and a second device. The first device is located closer to an inlet opening for cooling air for cooling the heatsink than the second device is. A height from the circuit board to a top of the first device is greater than a height from the circuit board to a top of the second device. The heatsink is not equipped with a cooling fin in a first region where the first device is provided, and the heatsink is equipped with a cooling fin in a second region where the second device is provided.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

FIGS. 1A-1D illustrate an example of an optical communication module. In this example, the optical communication module is an optical transceiver module that includes an optical transceiver.

Figure 1A:
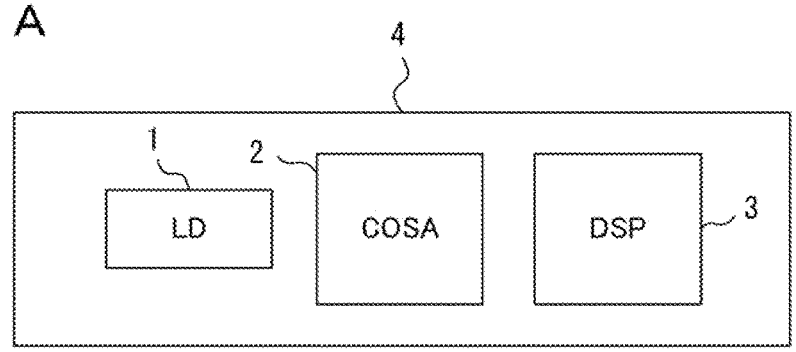
FIGS. 1A-1D illustrate an example of an optical communication module.

FIG. 1A illustrates an example of an optical transceiver. The optical transceiver includes a laser light source (LD) 1, an optical integrated circuit (coherent optical sub-assembly: COSA) 2, and a digital signal processor (DSP) 3. The laser light source 1, the optical integrated circuit 2, and the DSP 3 are examples of optical communication devices and implemented on a circuit board 4. For example, the circuit board 4 may be a printed circuit board on which a conductor pattern for propagating an electric signal is formed. The optical transceiver may include other components that are not depicted in FIG. 1A. For example, an electrical connector for inputting and outputting an electric signal and an optical connector for inputting and outputting an optical signal are omitted in FIG. 1A.

The laser light source 1 generates continuous wave light of a specified frequency. Continuous wave light generated by the laser light source 1 is used as carrier light for an optical signal output by the optical transceiver. Continuous wave light is also used for coherent detection of an optical signal.

The optical integrated circuit 2 includes an optical modulator and a coherent optical receiver. The optical modulator generates a modulated optical signal indicating a data signal supplied from the DSP 3. The coherent optical receiver includes a 90-degree optical hybrid circuit and a photodetector and generates an electric signal indicating electric field information of a received optical signal.

The DSP 3 generates a data signal from data supplied from an application and supplies the generated data signal to the optical integrated circuit 2. The DSP 3 recovers data from electric field information generated by the optical integrated circuit 2.

Figure 1B:
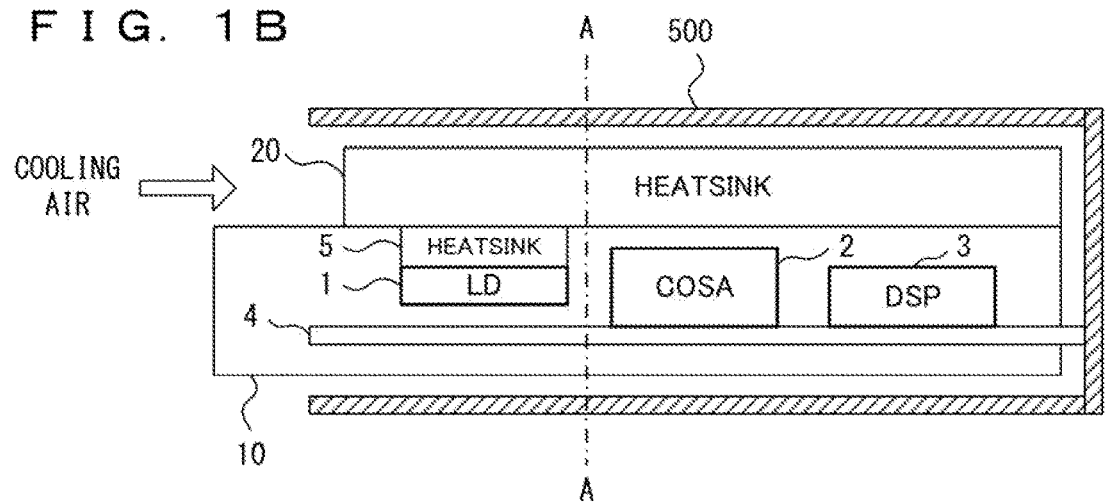

FIG. 1B is a diagram of the optical transceiver module that includes the optical transceiver depicted in FIG. 1A as seen from the side. In this drawing, a case for the optical transceiver module is transparently depicted so that the structure of the inside of the optical transceiver module can be viewed.

The optical transceiver module is equipped with a case 10 and a heatsink 20. The case 10 accommodates the optical transceiver depicted in FIG. 1A. That is, the laser light source 1, the optical integrated circuit 2, and the DSP 3 are accommodated in the case 10. A heatsink 5 is attached to the laser light source 1.

The heatsink 20 is attached to the case 10. The heatsink 20 is formed from a metal material having a high heat conductivity. The laser light source 1, the optical integrated circuit 2, and the DSP 3 are thermally connected to the heatsink 20. For example, the heatsink 5 may be fixed in contact with the heatsink 20. The optical integrated circuit 2 and the DSP 3 are in contact with the heatsink 20 via a material having a high heat conductivity.

In many cases, an optical transceiver module is used by being inserted into a space determined in advance. In this example, the optical transceiver module is accommodated in a cage 500. For example, the cage 500 may correspond to a slot in an optical transmitter device.

Figure 1C:
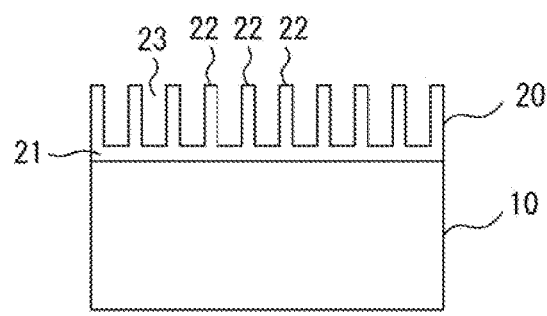

FIG. 1C depicts the configuration of a cross section of the heatsink 20. In particular, FIG. 1C indicates an A-A cross section depicted in FIG. 1B. Note that the inside of the case 10 is omitted in FIG. 1C.

In the example depicted in FIG. 1C, the heatsink 20 is formed from a base plate 21 and a plurality of cooling fins 22. The plurality of cooling fins 22 are formed to extend in a direction perpendicular to the base plate 21. Accordingly, grooves 23 are formed between the cooling fins 22. The heatsink 20 (i.e., the base plate 21 and the plurality of cooling fins 22) may be formed as a single body or integrally molded.

Figure 1D:
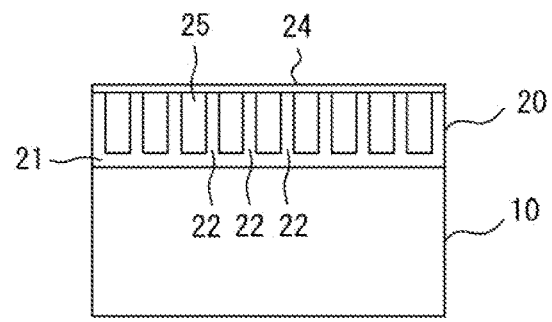

In the example depicted in FIG. 1D, a cover 24 is attached to the heatsink 20 illustrated in FIG. 1C. The cover 24 is provided so as to be parallel to the base plate 21 of the heatsink 20. Thus, the plurality of cooling fins 22 are disposed between the base plate 21 and the cover 24. Accordingly, the heatsink 20 includes a plurality of air passage holes 25. The heatsink 20 and the cover 24 may be formed as a single body or integrally molded.

While the optical transceiver module is in operation, cooling air is generated by a fan (not illustrated) so as to cool the laser light source 1, the optical integrated circuit 2, and the DSP 3. The cooling air is supplied toward the heatsink 20, as indicated by an arrow in FIG. 1B. In the example depicted in FIG. 1C, cooling air passes through the grooves 23. In the example depicted in FIG. 1D, cooling air passes through the air passage holes 25. As a result, heat generated by the laser light source 1, the optical integrated circuit 2, and the DSP 3 is dissipated efficiently via the heatsink 20.

Figure 2A:
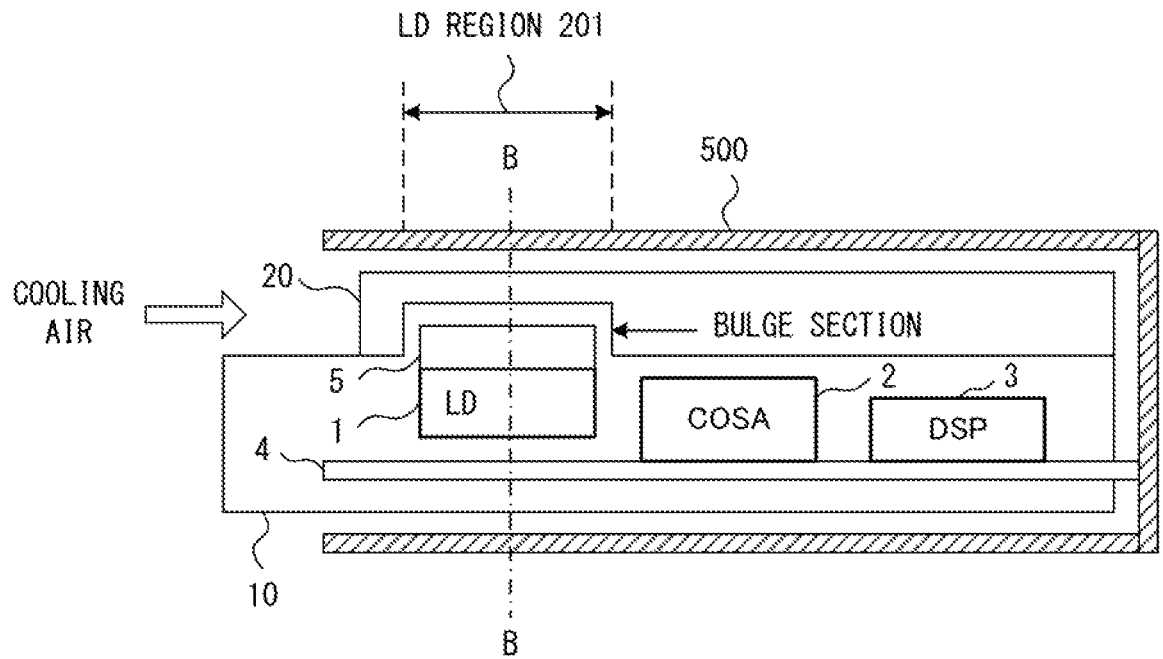
FIGS. 2A-2C illustrate another example of an optical communication module.
Figure 2B:
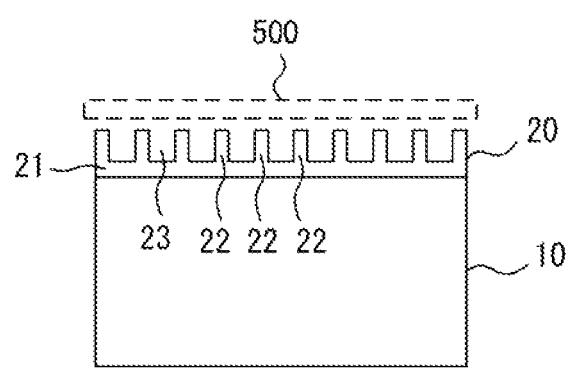
Figure 2C:
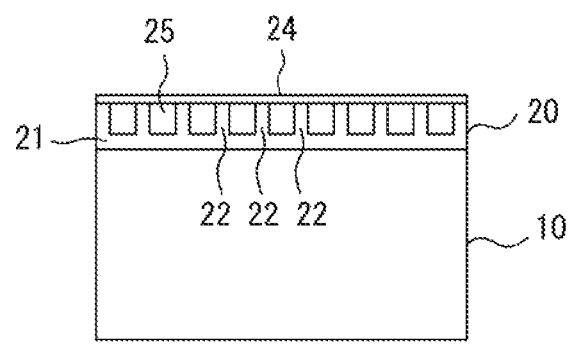

FIGS. 2A-2C illustrate another example of an optical communication module. The optical communication module depicted in FIGS. 2A-2C is also an optical transceiver module that includes an optical transceiver. The structure of the optical transceiver module depicted in FIGS. 2A-2C is substantially the same as that depicted in FIGS. 1B-1D.

However, the laser light source 1 of the optical transceiver module depicted in FIG. 2A is larger in size than that of the optical transceiver module illustrated in FIG. 1B. Accordingly, as depicted in FIG. 2A, the optical transceiver module includes a bulge section for accommodating the laser light source 1 and the heatsink 5. In particular, the heatsink 20 has a reduced height (or thickness) for the region where the laser light source 1 and the heatsink 5 are disposed. The region within the optical transceiver module where the laser light source 1 and the heatsink 5 are disposed may hereinafter be referred to as an "LD region 201."

As described above, increasing the size of the laser light source 1 results in the heatsink 20 having a reduced height in the LD region 201. For example, the height of the cooling fins 22 in the structure depicted in FIG. 2B have a reduced height in comparison with the structure illustrated in FIG. 1C. The air passage holes 25 in the structure depicted in FIG. 2C have a reduced size in comparison with the structure illustrated in FIG. 1D. Note that FIGS. 2B and 2C illustrate a B-B cross section indicated in FIG. 2A.

When cooling air is supplied as indicated in FIG. 2A, the cross-sectional area of the flow passage that the cooling air passages through decreases in the LD region 201. In particular, in the example depicted in FIG. 2B, the cross-sectional areas of the grooves 23 decrease in the LD region 201. In the example depicted in FIG. 2C, the cross-sectional areas of the air passage holes 25 decrease in the LD region 201. Thus, the airflow impedance in the structure depicted in FIGS. 2A-2C is higher than that in the structure illustrated in FIGS. 1B-1D. Note that an airflow impedance indicates a resistance against an airflow (i.e., level of difficulty with which air flows).

Figure 3:
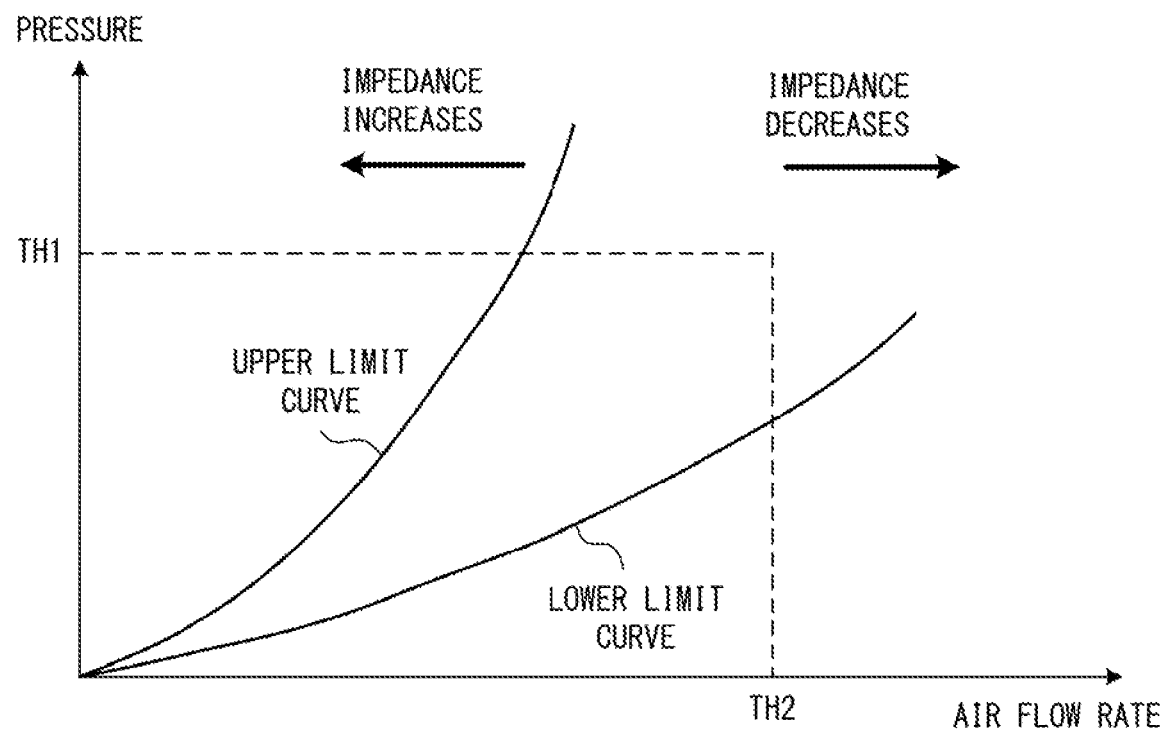
FIG. 3 is an explanatory diagram for airflow impedance.

FIG. 3 is an explanatory diagram for airflow impedance. The vertical axis indicates the pressure of cooling air, and the horizontal axis indicates the flow rate of cooling air.

In this example, the optical transceiver module is designed within the range of a specified airflow condition. For example, the optical transceiver module may be designed such that the temperature of the optical transceiver module is less than or equal to a specified threshold temperature when the pressure of cooling air is less than or equal to a threshold TH1 and the flow rate of cooling air is less than or equal to a threshold TH2. The optical transceiver module may be required to be operated within a range between an upper limit curve and a lower limit curve indicated in FIG. 3.

When the structure (or shape) of the optical transceiver module is changed, a characteristic curve indicating the relationship between the pressure and flow rate of cooling air changes. In particular, the characteristic curve changes when the structure of the heatsink 20 is changed. Specifically, the optical transceiver module depicted in FIGS. 2A-2C has a higher airflow impedance than the optical transceiver module illustrated in FIGS. 1B-1D. Hence, the characteristic curve of the optical transceiver module depicted in FIGS. 2A-2C is closer to the upper limit curve than the characteristic curve of the optical transceiver module depicted in FIGS. 1B-1D is.

Assuming that the pressure of cooling air is kept the same, the temperature of the optical transceiver module will increase more easily as the characteristic curve becomes closer to the upper limit curve. In other words, assuming that the temperature of the optical transceiver module is kept the same, the pressure of cooling air will need to be increased as the characteristic curve becomes closer to the upper limit curve. Thus, the cooling efficiency will be reduced when the cross-sectional areas of the grooves 23 or the air passage holes 25 are decreased, as indicated in FIGS. 2B and 2C.

EMBODIMENTS

Figure 4:
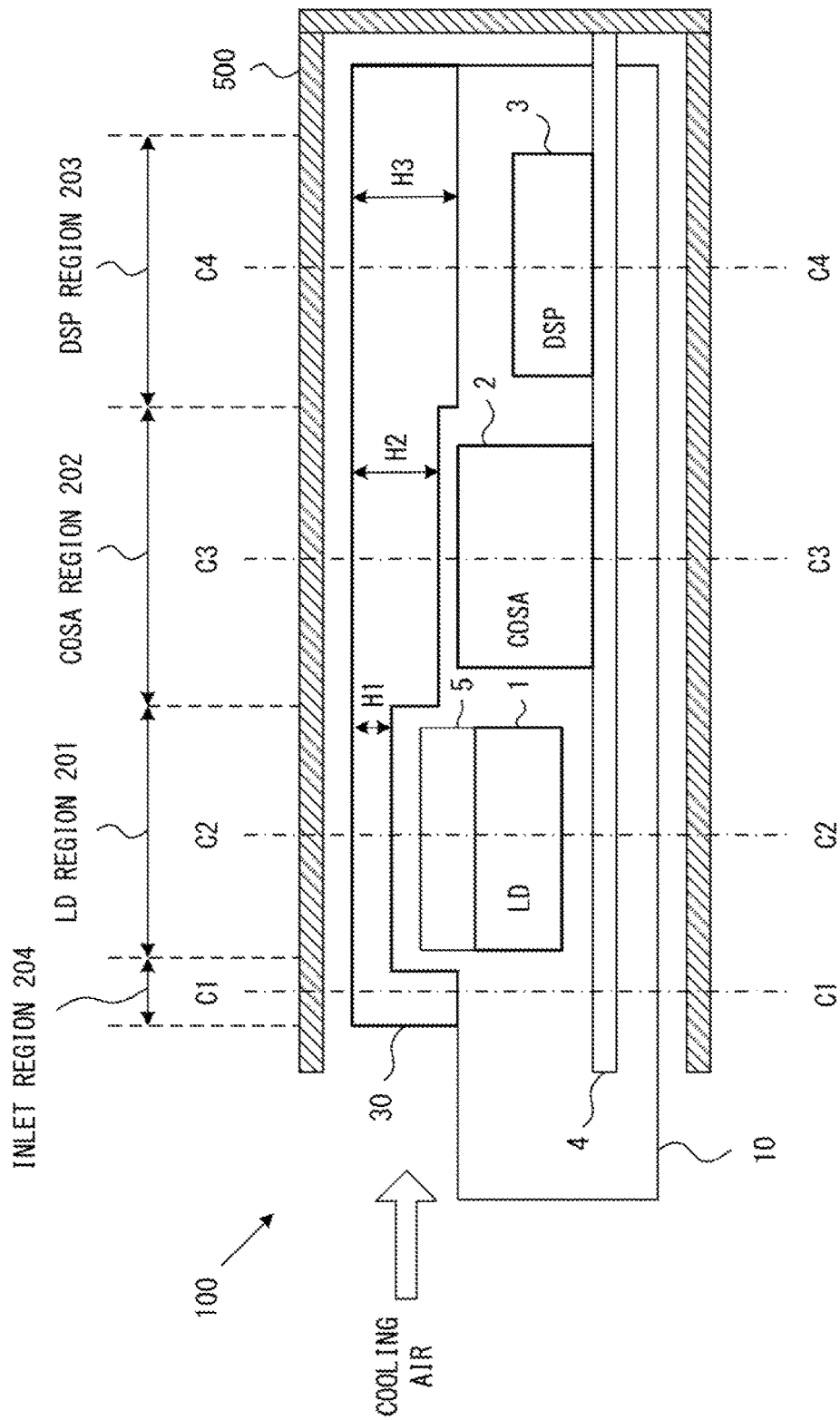
FIG. 4 illustrates an example of an optical communication module in accordance with embodiments of the present invention.

FIG. 4 illustrates an example of the optical communication module in accordance with embodiments of the present invention. The optical communication module depicted in FIG. 4 is also an optical transceiver module that includes an optical transceiver.

An optical transceiver module 100 includes a laser light source (LD) 1, an optical integrated circuit (COSA) 2, and a DSP 3. The laser light source 1 is provided on the upper surface side of a circuit board 4. A heatsink 5 is attached to the laser light source 1. The optical integrated circuit 2 and the DSP 3 are implemented on the surface of the circuit board 4. The laser light source 1, the optical integrated circuit 2, the DSP 3, the circuit board 4, and the heatsink 5 are accommodated in a case 10. The laser light source 1 (and the heatsink 5) is fixed to the case 10 or a heatsink 30 (described hereinafter).

The heatsink 30 is attached to the case 10. The heatsink 30 is formed from a metal material having a high heat conductivity. The laser light source 1, the optical integrated circuit 2, and the DSP 3 are thermally connected to the heatsink 30. For example, the laser light source 1 may be thermally connected to the heatsink 30 via the heatsink 5 and a heat conducting material (not illustrated). The optical integrated circuit 2 and the DSP 3 are thermally connected to the heatsink 30 via a heat conducting material (not illustrated).

A region where the laser light source 1 is disposed may hereinafter be referred to as an "LD region 201." A region where the optical integrated circuit 2 is disposed may be referred to as a "COSA region 202." A region where the DSP 3 is disposed may be referred to as a "DSP region 203."

The shape of the heatsink 30 is designed in accordance with a multi-source agreement (MSA) that the optical transceiver module 100 is compliant with and the positioning and sizes of the optical communication devices (i.e., the laser light source 1, the optical integrated circuit 2, and the DSP 3). In this example, the heatsink 30 is formed such that the spacing in the LD region 201 between the bottom surface of the heatsink 30 and the circuit board 4 is larger than the spacing in each of the COSA region 202 and the DSP region 203 between the bottom surface of the heatsink 30 and the circuit board 4. Specifically, when the heatsink 30 has a thickness H1 in the LD region 201, a thickness H2 in the COSA region 202, and a thickness H3 in the DSP region 203, the thickness H1 is less than the thickness H2 and the thickness H3 as depicted in FIG. 4. Although H3 is greater than H2 in the example depicted in FIGS. 4, H2 and H3 may be equal.

FIGS. 5A-5D illustrate the shapes of cross sections of the heatsink 30 of the optical transceiver module 100 depicted in FIG. 4. Note that FIGS. 5A-5D depict portions of the case 10 and the cage 500 in addition to the heatsink 30.

Figure 5A:
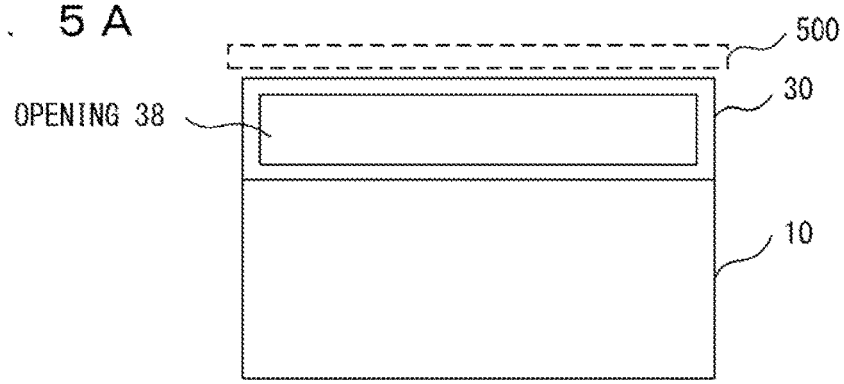
FIGS. 5A-5D illustrate the shapes of cross sections of a heatsink of an optical transceiver module depicted in FIG. 4.

FIG. 5A depicts a C1-C1 cross section indicated in FIG. 4. In particular, FIG. 5A depicts a cross section of an end portion of the heatsink 30 that is located on a side on which cooling air flows in (i.e., inlet region 204). The heatsink 30 includes an opening 38 in the inlet region 204. Thus, cooling air supplied as depicted in FIG. 4 passes through the opening 38.

Figure 5B:
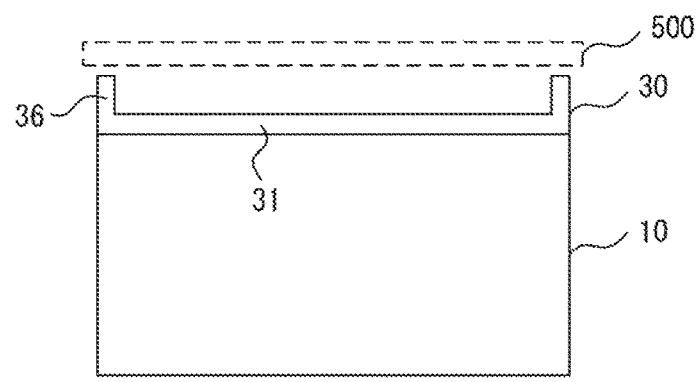

FIG. 5B depicts a C2-C2 cross section indicated in FIG. 4. In particular, FIG. 5B depicts a cross section of the heatsink 30 that is located in the LD region 201. The portion of the heatsink 30 that is located in the LD region 201 is formed from a plate 31 and holding members 36. The plate 31 has a flat shape. The holding members 36 are provided on both edge portions of the plate 31 so as to hold a cover 34 (described hereinafter). In a configuration in which the cover 34 is not attached to the heatsink 30, the holding member 36 is not necessarily needed. In any case, the heatsink 30 does not have a cooling fin in the LD region 201.

Figure 5C:
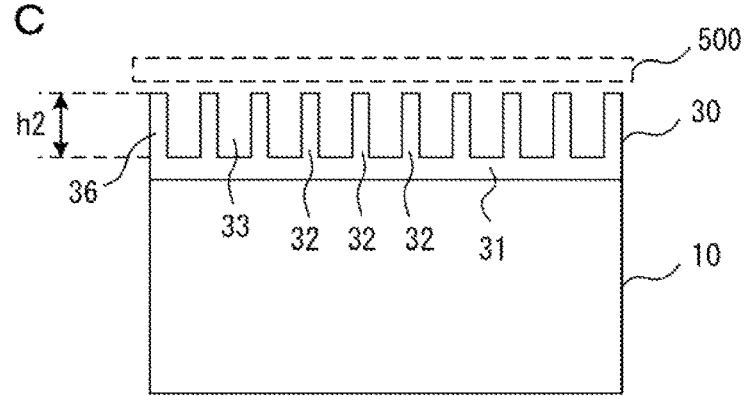

FIG. 5C depicts a C3-C3 cross section indicated in FIG. 4. In particular, FIG. 5C depicts a cross section of the heatsink 30 that is located in the COSA region 202. The portion of the heatsink 30 that is located in the COSA region 202 is formed from the plate 31, cooling fins 32, and the holding members 36. The cooling fins 32 are formed from a plurality of protrusions extending in a direction perpendicular to the plate 31. Accordingly, grooves 33 are formed between the cooling fins 32.

Figure 5D:
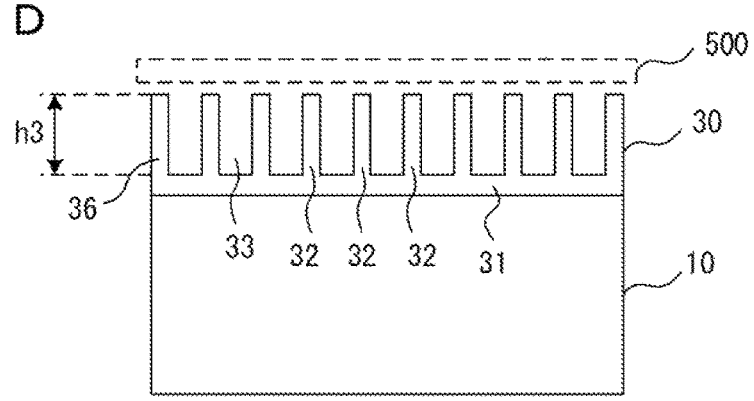

FIG. 5D depicts a C4-C4 cross section indicated in FIG. 4. In particular, FIG. 5D depicts a cross section of the heatsink 30 that is located in the DSP region 203. The heatsink 30 has substantially the same structure in the COSA region 202 and the DSP region 203. Hence, the portion of the heatsink 30 that is located in the DSP region 203 is also formed from the plate 31, the cooling fins 32, and the holding members 36. However, the height of the cooling fins 32 in the COSA region 202 may be different from the height of the cooling fins 32 in the DSP region 203. In this example, when the cooling fins 32 in the COSA region 202 have a height h2 and the cooling fins 32 in the DSP region 203 have a height h3, the height h3 is greater than the height h2.

As indicated above, in the optical transceiver module 100, the laser light source 1 is located closer to the inlet opening for cooling air than the optical integrated circuit 2 and the DSP 3 are. The height from the circuit board 4 to the top of the laser light source 1 (including the heatsink 5) is greater than each of the height from the circuit board 4 to the top of the optical integrated circuit 2 and the height from the circuit board 4 to the top of the DSP 3. The heatsink 30 is not equipped with cooling fins in the LD region 201 in which the laser light source 1 is provided, but is equipped with the cooling fins 32 in the COSA region 202 and the DSP region 203 in which the optical integrated circuit 2 and the DSP 3 are provided.

While the optical transceiver module 100 is in operation, cooling air is generated by a fan (not illustrated) so as to cool the heatsink 30 (i.e., cool the laser light source 1, the optical integrated circuit 2, and the DSP 3). The cooling air is supplied toward the heatsink 30, as indicated by an arrow in FIG. 4. The cooling air passes through the opening 38 depicted in FIG. 5A. In the example depicted in FIGS. 4 and 5A-5D, a cover is not attached to the heatsink 30.

In the LD region 201, cooling air passes through a space between the plate 31 and the gage 500 depicted in FIG. 5B. In the COSA region 202 and the DSP region 203, cooling air passes through the grooves 33 depicted FIGS. 5C and 5D. As a result, heat generated by the laser light source 1, the optical integrated circuit 2, and the DSP 3 is dissipated efficiently via the heatsink 30.

In the configuration depicted in FIGS. 2A-2C, the heatsink 20 includes the cooling fins in the LD region 201. However, the cooling fins 22 are short, and the grooves 23 have a small cross section. Thus, the airflow impedance against cooling air is high in the LD region 201, thereby reducing the cooling efficiency.

By contrast, in the optical transceiver module 100 depicted in FIGS. 4 and 5A-5D, the heatsink 30 does not include the cooling fins in the LD region 201 in which the heatsink 30 has the decreased height H1. Thus, the flow passage through which cooling air passes has a large cross-sectional area, so the airflow impedance against the cooling air is low in the LD region 201. Hence, a sufficient amount of cooling air can pass through the LD region 201. That is, a sufficient amount of cooling air is supplied to the COSA region 202 and the DSP region 203. The heatsink 30 is equipped with the cooling fins 32 in the COSA region 202 and the DSP region 203. However, the cooling fins 32 have the sufficient heights h2 and h3, and the grooves 33 have a large cross-sectional area. Thus, the airflow impedance against cooling air is also not high in the COSA region 202 and the DSP region 203. Accordingly, heat generated by the laser light source 1, the optical integrated circuit 2, and the DSP 3 is dissipated efficiently via the heatsink 30.

Variations

Figure 6:
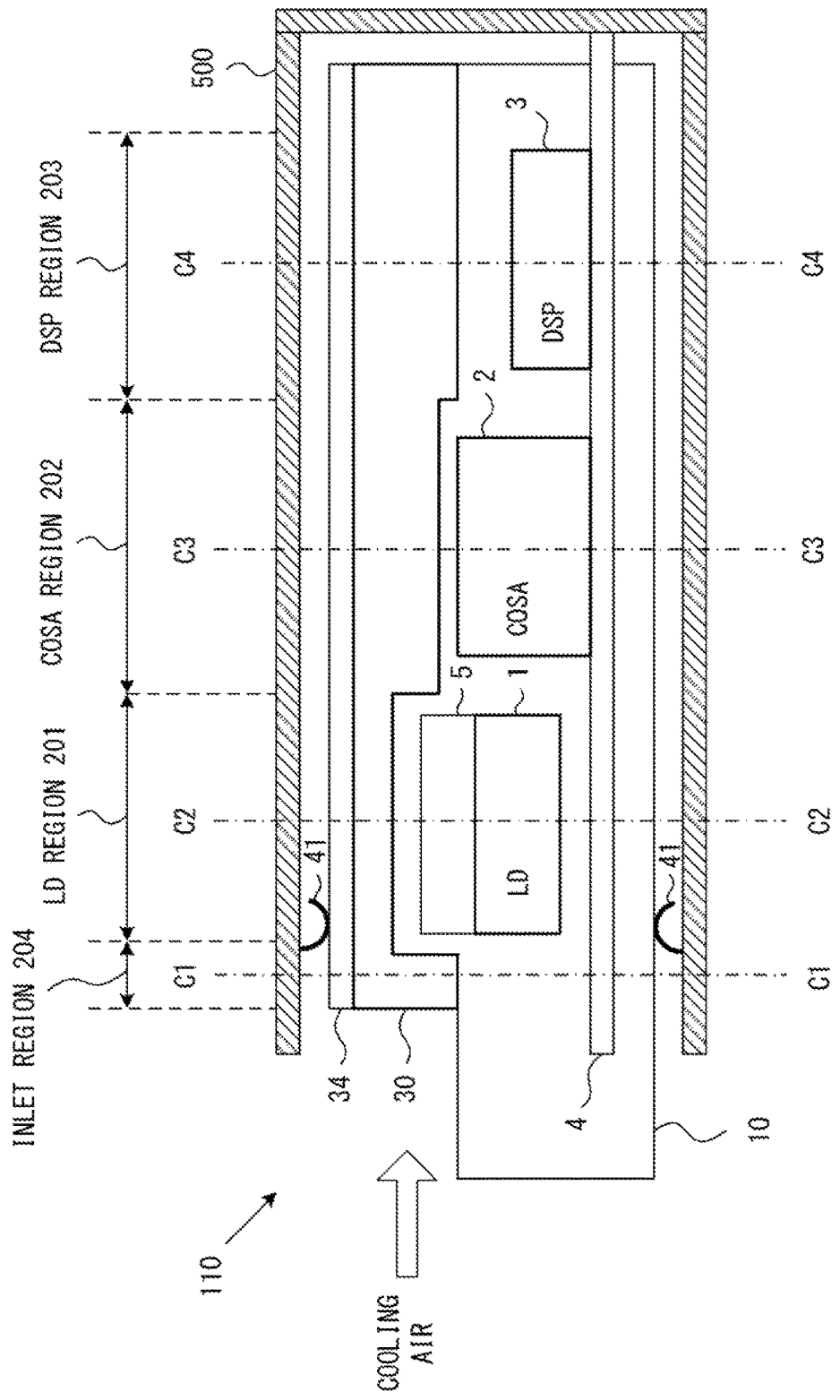
FIG. 6 illustrates a first variation of an optical communication module in accordance with embodiments of the present invention.

FIG. 6 illustrates a first variation of the optical communication module in accordance with embodiments of the present invention. An optical transceiver module 110 in accordance with the first variation can be provided by attaching the cover 34 to the optical transceiver module 100 depicted in FIG. 4.

FIGS. 7A-7D illustrate the shapes of cross sections of the heatsink 30 of the optical transceiver module 110 depicted in FIG. 6. FIGS. 7A, 7B, 7C, and 7D respectively depict a C1-C1 cross section, a C2-C2 cross section, a C3-C3 cross section, and a C4-C4 cross section indicated in FIG. 6.

The cover 34 is fixed to the heatsink 30. Although not particularly limited, the cover 34 is fixed to the heatsink 30 by using, for example, a screw. In this case, the screw is an example of a coupling means for fixing the cover 34 to the heatsink 30. Alternatively, the cover 34 may be fixed to the heatsink 30 by using a specified conducting material. For example, the conducting material may be solder or a conductive adhesive. In this case, noise radiation of the optical transceiver module is reduced. As with the heatsink 30, the cover 34 is preferably formed from a metal material having a high heat conductivity. As an example, the cover 34 may be formed from the same material as the heatsink 30. In this case, the cover 34 also functions as a heatsink. The heatsink 30 and the cover 34 may be formed from the same material as a single body or integrally molded.

Figure 7A:
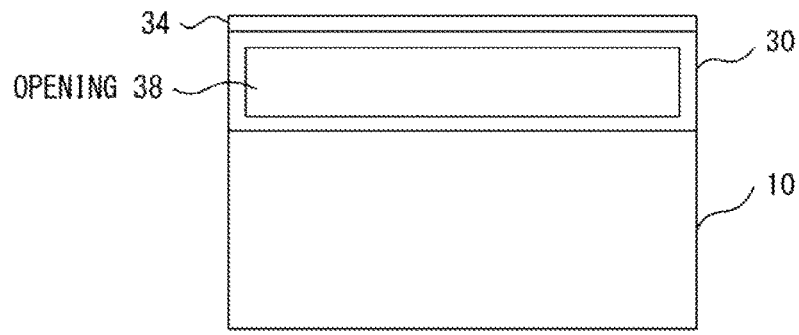
FIGS. 7A-7D illustrate the shapes of cross sections of a heatsink of an optical transceiver module depicted in FIG. 6.
Figure 7B:
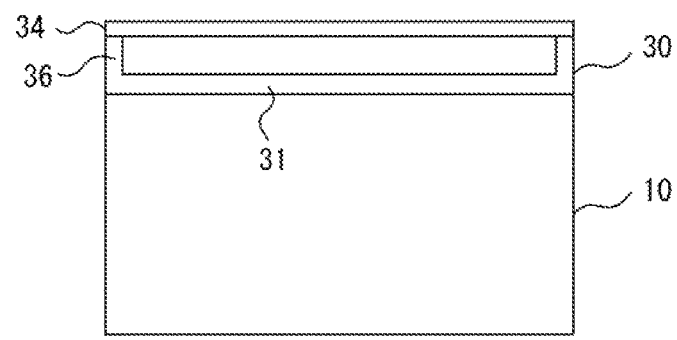

In the LD region 201, a space surrounded by the heatsink 30 and the cover 34 is formed as depicted in FIG. 7B. Cooling air passes through this space. In this example, the heatsink 30 does not include cooling fins in the LD region 201. Thus, the optical transceiver module 110 has an improved cooling efficiency in comparison with the structure depicted in FIG. 2C since the airflow impedance in the LD region 201 is low.

Figure 7C:
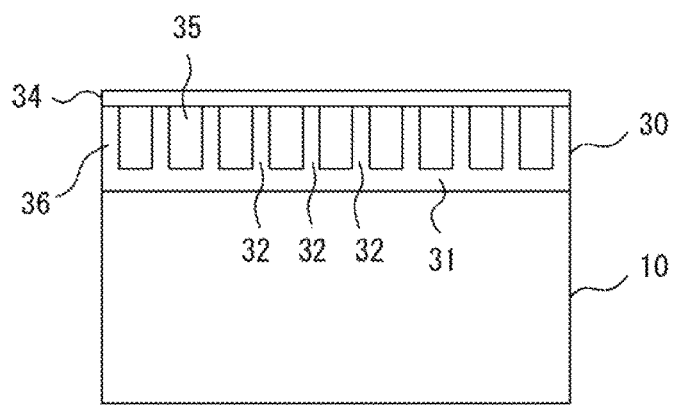
Figure 7D:
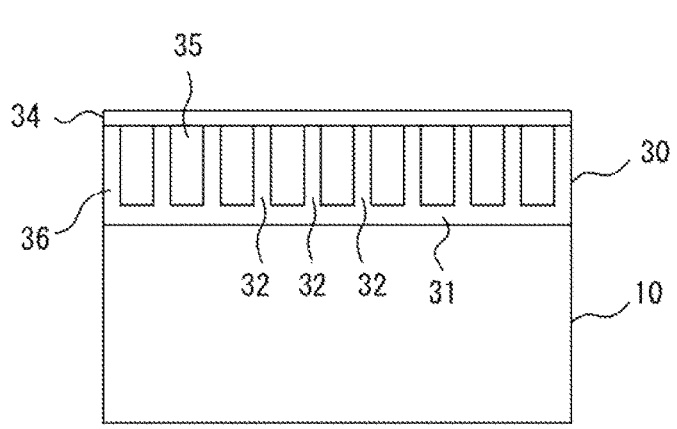

In the COSA region 202 and the DSP region 203, a plurality of air passage holes 35 are formed by the cooling fins 32 of the heatsink 30 and the cover 34, as depicted in FIGS. 7C and 7D. Cooling air flows through the air passage holes 35.

EMI fingers 41 may be provided along outer surfaces of the optical transceiver module 110 so as to reduce noise radiation. The EMI fingers 41 may be provided outside the case 10 and inside the cover 34. The EMI fingers 41 may be provided such that the EMI fingers 41 come into contact with an inner wall of the cage 500 when the optical transceiver module 110 is inserted into the cage 500.

Figure 8:
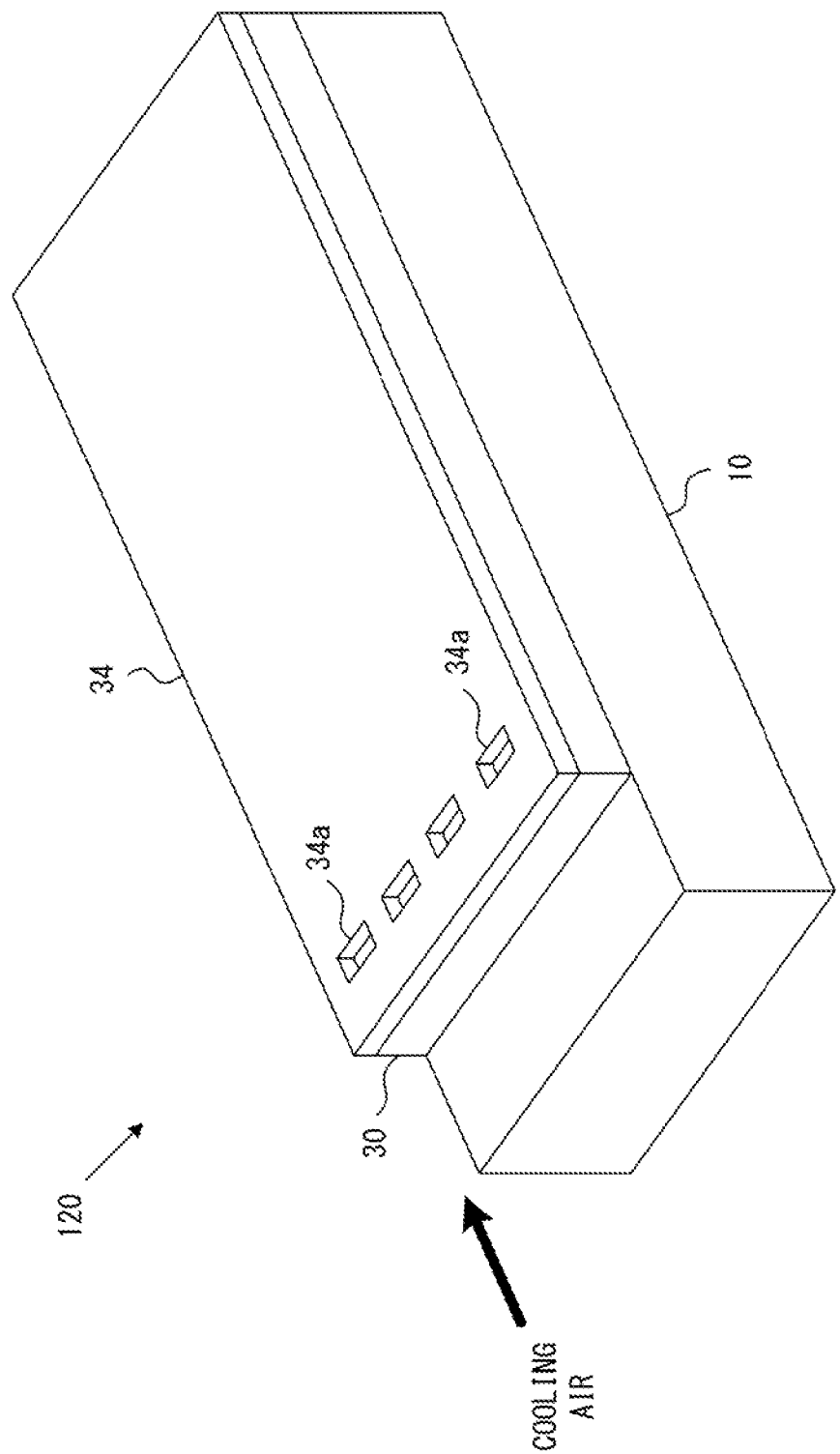
FIG. 8 illustrates a second variation of an optical communication module in accordance with embodiments of the present invention.

FIG. 8 illustrates a second variation of the optical communication module in accordance with embodiments of the present invention. An optical transceiver module 120 in accordance with the second variation is implemented by forming a plurality of vent holes 34a in the cover 34 of the optical transceiver module 110 depicted in FIG. 6. For example, the vent holes 34a may be formed in the LD region 201 depicted in FIG. 6. This structure improves the cooling efficiency.

Figure 9:
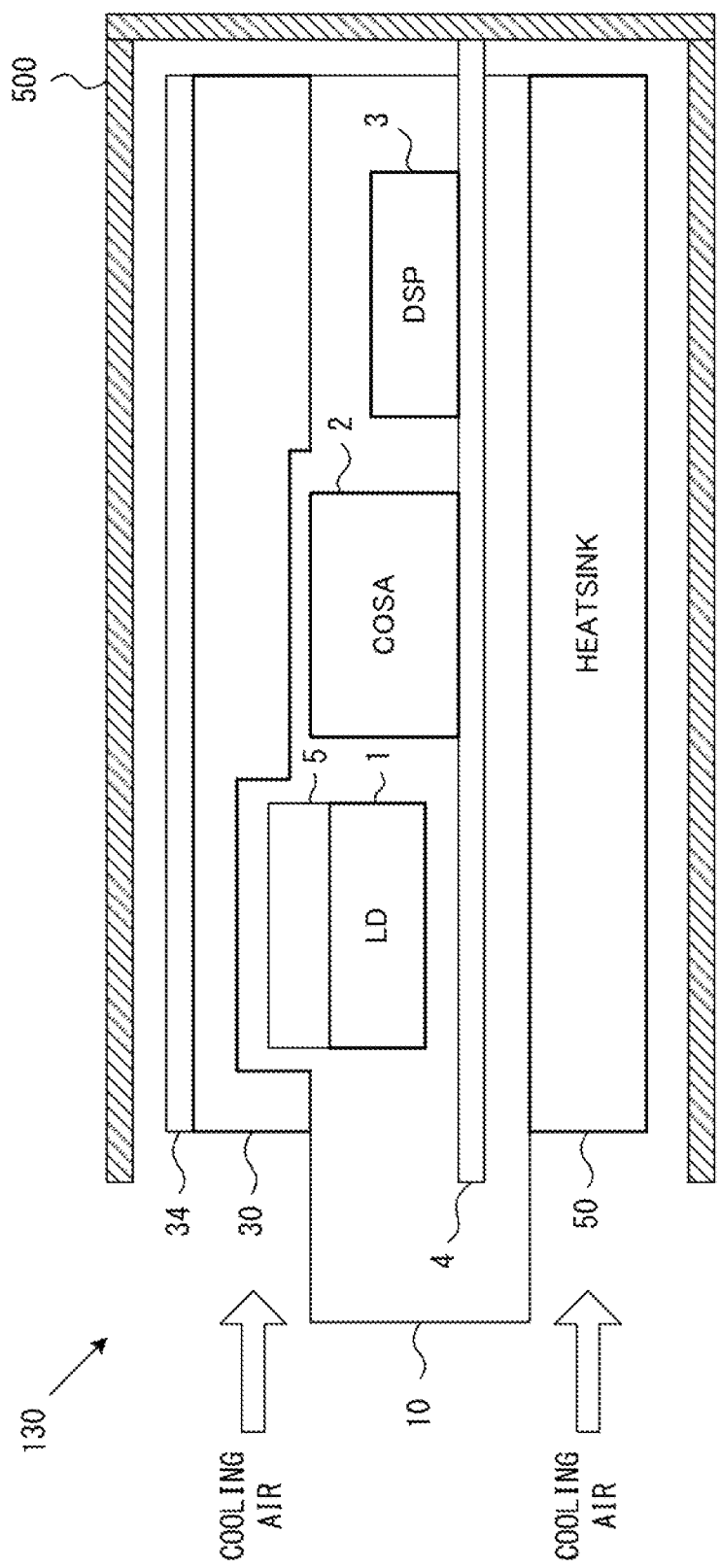
FIG. 9 illustrates a third variation of an optical communication module in accordance with embodiments of the present invention.

FIG. 9 illustrates a third variation of the optical communication module in accordance with embodiments of the present invention. An optical transceiver module 130 in accordance with the third variation is implemented by attaching a heatsink 50 to the optical transceiver module 110 depicted in FIG. 6. In this example, the heatsink 50 is attached to the lower side of the case 10. Thus, the heatsink 50 is provided on the side of the circuit board 4 on which the optical communication devices (the laser light source 1, the optical integrated circuit 2, and the DSP 3) are not provided. This structure improves the cooling efficiency. Cooling air is preferably supplied not only to the heatsink 30 but also to the heatsink 50. The shape of the heatsink 50 is designed in accordance with the structure of the cage 500. In addition, the heatsink 50 may be attached to the optical transceiver module 100 depicted in FIG. 4.

In the embodiments depicted in FIGS. 4-9, the optical communication module is an optical transceiver module. However, the present invention is not limited to this. Accordingly, the present invention may be applied to, for example, an optical transmitter module or an optical receiver module.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical communication module comprising:
   a circuit board;
   optical communication devices that are provided on an upper surface side of the circuit board;
   a case that accommodates the circuit board and the optical communication devices; and
   a heatsink that is attached to the case,
   wherein
   the optical communication devices include a first device and a second device,
   the first device is located closer to an inlet opening for cooling air for cooling the heatsink than the second device is,
   a height from the circuit board to a top of the first device is greater than a height from the circuit board to a top of the second device,
   the heatsink is not equipped with a cooling fin in a first region where the first device is provided, and the heatsink is equipped with a cooling fin in a second region where the second device is provided, and the cooling air is provided through the inlet opening and flows in a direction from the first region where the first device is implemented to the second region where the second device is implemented in the case.

2. The optical communication module according to claim 1, wherein the cooling fin is formed on an upper surface side of the heatsink, and a lower surface of the heatsink is thermally in contact with the optical communication device.

3. The optical communication module according to claim 1, further comprising:

a cover on an upper surface side of the heatsink, wherein a space through which the cooling air flows is formed in the first region between the heatsink and the cover, and a plurality of air passage holes through which the cooling air flows are formed in the second region by the cooling fin and the cover.

4. The optical communication module according to claim 3, wherein the heatsink and the cover are formed as a single body.

5. The optical communication module according to claim 3, wherein the cover is fixed to the heatsink by a coupling means or a conductive material.

6. The optical communication module according to claim 1, wherein a spacing between the heatsink and the circuit board in the first region is larger than a spacing between the heatsink and the circuit board in the second region.

7. The optical communication module according to claim 1, further comprising:

a second heatsink on a bottom surface side of the case.

* * * * *